United States Patent
Hammam

(10) Patent No.: US 7,968,141 B2
(45) Date of Patent: Jun. 28, 2011

(54) METHOD FOR PRODUCING CONTACT TERMINAL WITH TEXTURED SURFACE AND USE THEREOF

(75) Inventor: Tag Hammam, Sundbyberg (SE)

(73) Assignee: Luvata Oy, Espoo (FI)

( * ) Notice: Subject to any disclaimer, the term of this patent is extended or adjusted under 35 U.S.C. 154(b) by 940 days.

(21) Appl. No.: 10/497,836

(22) PCT Filed: Dec. 3, 2002

(86) PCT No.: PCT/FI02/00976
§ 371 (c)(1),
(2), (4) Date: Jun. 7, 2004

(87) PCT Pub. No.: WO03/050919
PCT Pub. Date: Jun. 19, 2003

(65) Prior Publication Data
US 2005/0019495 A1      Jan. 27, 2005

(30) Foreign Application Priority Data
Dec. 13, 2001   (FI) ..................................... 20012454

(51) Int. Cl.
*B05D 3/12*     (2006.01)
(52) U.S. Cl. ........................................ 427/98.8; 427/58

(58) Field of Classification Search .................. 427/299, 427/359, 428.04, 428.06, 63, 71, 97.3, 98.5, 427/98.6, 98.8; 252/12, 12.2
See application file for complete search history.

(56) References Cited

U.S. PATENT DOCUMENTS

| | | | | |
|---|---|---|---|---|
| 4,119,875 A | * | 10/1978 | Noguchi et al. | 310/248 |
| 4,425,247 A | | 1/1984 | Bely et al. | 252/12 |
| 5,521,030 A | * | 5/1996 | McGrew | 430/1 |
| 6,083,837 A | * | 7/2000 | Millet | 438/691 |
| 6,254,979 B1 | * | 7/2001 | Drew et al. | 428/323 |
| 6,894,235 B2 | * | 5/2005 | Mihara | 200/11 R |

FOREIGN PATENT DOCUMENTS
EP         1 081 251       11/2003

* cited by examiner

*Primary Examiner* — Michael Cleveland
*Assistant Examiner* — Tabassom Tadayyon Eslami
(74) *Attorney, Agent, or Firm* — Hodgson Russ LLP

(57) ABSTRACT

The invention relates to a method for producing a contact terminal for electrical matters made of copper or a copper-base alloy in order to increase the reliability and lifetime of the contact terminal. According to the invention a textured structure is formed on the surface of the contact terminal by rolling of patterns. The invention also relates to a use of a textured structure based on cavities formed on the surface of a contact terminal for preserving a lubricant.

12 Claims, No Drawings

METHOD FOR PRODUCING CONTACT TERMINAL WITH TEXTURED SURFACE AND USE THEREOF

This invention relates to a method for producing an electrical contact terminal having a textured surface and use therefor to preserve lubricant in order to increase the reliability and lifetime of the contact terminal by manufacturing a contact material built in reservoirs for the lubricant.

Tin-coated copper-base alloys are commonly used in electrical contact terminals due to a low price and an acceptable reliability for many applications. Tin-coated electric contacts are also used for separable contacts of plug-in-type with restricted number of insertion and withdrawal cycles, for instance printed circuit board contacts and pin-socket contacts.

The main deterioration mechanism of tin-coated contact terminals is mechanical deterioration caused by macro-wear during insertion/withdrawal and fretting during operation. It is well known that a very small amount of lubricant significant reduces wear, as well as restricts oxidation of the surfaces. Hence, a small amount of an appropriate lubricant significantly enhances the reliability of a contact terminal. However, during long term operation the lubricant might be removed from the contact spot due to mechanical movement and/or by migration. Since contact terminals are not relubricated this will by the time result in non-lubricated contact spots, with subsequently restricted reliability. Therefore, an effective supply of lubricant to the contact area during the entire lifetime of the connector is of decisive importance to ensure a low and stable contact resistance.

One way to improve the supply of lubricant is by using a reservoir. However, the production cost for connectors with the entire contact terminals immersed in a lubricant is high.

The object of the present invention is to eliminate some drawbacks of the prior art and to achieve a new method for producing a contact terminal for electrical matters made of copper or a copper-base alloy, which has a textured structure on the surface to preserve lubricant in order to increase the reliability and lifetime of the connector. The essential features of the invention are enlisted in the appended claims.

In accordance with the method of the present invention a contact terminal is produced for electrical matters which contact terminal is provided with a contact material having a textured structure on the surface. The contact material contains a contact substrate which is coated or uncoated. If the contact material is coated the coat contains a conductive material such as tin, silver or gold. The textured structure is advantageously formed on the desired surface by rolling of patterns. The patterns form the textured structure on the surface of the contact material and when the contact material is coated the textured structure is formed on the surface of the coating material.

The contact substrate where the textured surface is aimed to form, is driven to a mechanical contact with at least one roller advantageously so that the contact substrate is driven into the gap between two rollers of a rolling machine. The surface of at least one of the two rollers is provided with patterns for the desired textured surface. In another embodiment of the present invention the contact substrate is driven to a mechanical contact with a single roller which surface is provided with patterns for the desired textured surface. The roller is pressed for a mechanical contact towards the surface of the contact substrate when the contact substrate is passed the roller. After the mechanical contact with the roller the surface of the contact substrate is provided with a desired amount of cavities or depressions which form the textured structure of the present invention. The cavities cover 5-50% of the total surface area of the contact substrate. The shape of the cavities or depressions is advantageously a circular contact spot surrounded by a zone which is at least partly under or over the surface of the contact substrate and which at least partly prevents the lubricant to flow from the contact spot to the surface of the contact substrate surrounding the contact spot. The shape of the cavities or depressions can also be for instance oval or elongated cavities. When the shape of the cavities is circular, the diameter is between 20-200 micrometer.

The textured structure on the surface is advantageously used as reservoirs for a lubricant applied on the surface of the contact material. The textured structure is thus for preserving lubricant during long term operation, and to ensure a low contact resistance for the contact terminal.

The effect of the present invention compared with the prior art was tested using a tin-coated copper alloy substrate. In accordance with the present invention a textured structure was formed by rolling patterns on the surface of the coating of the substrate. The sample in accordance with prior art was tested without any patterns on the surface of the coating of the substrate. The friction, macro-wear and electric properties were tested in a model contact tool where the contact was constituted of a flat stationary sample and a moving rider without patterns on the surface.

The substrate was a strip of a copper tin alloy containing 4 weight-% tin and had a thickness of 0.4 millimeter. This substrate was coated with 5 micrometer thick electroplated tin and heat-treated 0.5 hour at the temperature of 173° C. to achieve an intermetallic compound as thick as for non-heated hot dipped tin. The tests were run both with and without lubrication. The standard surface without any textured structure was used for all of the riders, and the riders were formed after plating.

The textured structure was formed by rolling so that the coated contact substrate strip was driven through the gap between the rollers of a rolling machine. The surfaces of the rollers were so constructed that after the rolling treatment the coating of the substrate strip was based on patterns containing cavities with a diameter of 0.1 millimeter. The depth of the cavities was about 40 micrometers and the cavities covered about 24% of the total surface area of the coated substrate strip.

The following test conditions were used: sliding length 5 millimeter per stroke and normal force 1.2, 2.2 and 5.2 Newton. The tests were run under a load of 2 Ampere of direct current, and the moving rider was as a cathode. The open-circuit voltage was not limited and a measuring method of four points was used to determine the electric resistance over the contact spot. Two sliding speeds were used: a low speed of 50 millimeter per minute and a high speed of 200 millimeter per minute. The total number of cycles for each test was 60 cycles for the low speed and 250 cycles for the high speed.

The differences between a standard surface and a surface with the textured structure of cavities are pronounced when an appropriate lubricant is added. Cavities in combination with an appropriate lubricant showed an outstanding stability during the macro-wear tests especially for a low normal load. This is because the lubricant restricts mechanical degradation of the contact area and prevents the contact area to be oxidized. Furthermore, using a lubricant can reduce the insertion/withdrawal force. The tests showed that the main reason why the lubrication decreases the insertion/withdrawal force for a specific contact resistance is that one part of the friction force is almost eliminated when using a lubricant. The plowing force can be reduced without affecting the contact resistance. Further, the low and stable contact resistance when using cavities according to the invention together with a lubricant is due to an effective supply of lubricant to the contact area, and that the lubricant enhanced the transportation of wear debris out from the central contact area.

The invention claimed is:

1. Method for producing a contact terminal for electrical matters made of copper or a copper-base alloy in order to increase the reliability and lifetime of the contact terminal, comprising forming a textured structure with cavities having diameters between 20 to 200 micrometers on the surface of the contact terminal by rolling of patterns.

2. Method according to claim 1, further comprising driving the surface to be textured into the gap between two rollers of a rolling machine.

3. Method according to claim 1, further comprising driving the surface to be textured to a mechanical contact with at least one roller.

4. Method according to claim 3, wherein the mechanical contact between at least one roller and the contact terminal form cavities on a coated surface of the contact terminal.

5. Method according to claim 3, wherein the mechanical contact between at least one roller and the contact terminal form cavities on the surface of the contact terminal.

6. Method according to claim 5, wherein the textured structure is based on cavities produced by at least one roller and which cavities cover 5-50% of the total surface area of the contact substrate of the contact terminal.

7. Method according to claim 5, wherein the cavities produced by at least one roller consist of circular contact spots each surrounded by a zone which is at least partly under or over the surface of the contact substrate.

8. Method according to claim 5, wherein the cavities produced by at least one roller are circular in shape.

9. Method according to claim 5, wherein the cavities produced by at least one roller are oval in shape.

10. Method according to claim 5, wherein the cavities produced by at least one roller are elongated in shape.

11. A method for producing a contact terminal for electrical matters made of copper or a copper-base alloy in order to increase the reliability and lifetime of the contact terminal, comprising forming a textured structure on the surface of the contact terminal by rolling patterns and forming cavities having diameters in the range of 20 micrometers to 200 micrometers;

forming each of the cavities to have a contact spot with a zone partly under the surface of the contact terminal; and, disposing a lubricant in the cavities and allowing the zone partly under the surface of the contact terminal to partly prevent the lubricant from flowing to the surface of the contact terminal surrounding the cavities.

12. The method according to claim 11, further including providing the shape of the contact spot to be one of the following: a circular contact spot, an oval contact spot or an elongate contact spot.

* * * * *